United States Patent
Lunglmayr et al.

(10) Patent No.: US 8,082,478 B2
(45) Date of Patent: Dec. 20, 2011

(54) RETRANSMISSION OF ERRONEOUS DATA

(75) Inventors: Michael Lunglmayr, München (DE); Jens Berkmann, München (DE)

(73) Assignee: Infineon Technologies AG, Neubiberg (DE)

( * ) Notice: Subject to any disclaimer, the term of this patent is extended or adjusted under 35 U.S.C. 154(b) by 1001 days.

(21) Appl. No.: 12/018,932

(22) Filed: Jan. 24, 2008

(65) Prior Publication Data

US 2009/0193311 A1    Jul. 30, 2009

(51) Int. Cl.
*G08C 25/02* (2006.01)

(52) U.S. Cl. .......... 714/748; 714/48; 714/746; 714/749; 714/751; 714/752; 714/790; 714/794

(58) Field of Classification Search ........................ None
See application file for complete search history.

(56) References Cited

U.S. PATENT DOCUMENTS

| | | | | |
|---|---|---|---|---|
| 6,141,784 | A * | 10/2000 | Davis et al. | 714/748 |
| 6,161,207 | A * | 12/2000 | Lockhart et al. | 714/758 |
| 6,438,723 | B1 * | 8/2002 | Kalliojarvi | 714/751 |
| 7,106,813 | B1 * | 9/2006 | Ling | 375/343 |
| 7,411,903 | B2 * | 8/2008 | Jang et al. | 370/230 |
| 2004/0243901 | A1 * | 12/2004 | Wang | 714/746 |
| 2005/0097425 | A1 * | 5/2005 | Golitschek et al. | 714/749 |
| 2006/0085717 | A1 * | 4/2006 | Tomaru et al. | 714/748 |
| 2006/0109810 | A1 * | 5/2006 | Au et al. | 370/328 |
| 2008/0240159 | A1 * | 10/2008 | Palanki et al. | 370/474 |
| 2009/0031183 | A1 * | 1/2009 | Hoshino et al. | 714/748 |
| 2009/0031185 | A1 * | 1/2009 | Xhafa et al. | 714/751 |
| 2009/0103480 | A1 * | 4/2009 | Tong et al. | 370/328 |
| 2009/0217120 | A1 * | 8/2009 | Sawahashi et al. | 714/750 |
| 2010/0125768 | A1 * | 5/2010 | Mauchly et al. | 714/749 |

OTHER PUBLICATIONS

"Encyclopedia of Sparse Graph Codes", David J.C. MacKay, reprinted from the Internet at: www.inference.phy.cam.ac.uk/mackay/codes/data.html, 37 pgs, Dec. 28, 2007.
"Adaptive Methods for Linear Programming Decoding", Mohammad H. Taghavi N. and Paul H. Siegel, arXif:ex/0703123v1 (es.IT) Mar. 24, 2007, 22 pgs.
"Automatic-Repeat-Request Error-Control Schemes", Shu Lin, Daniel J. Costello, Jr., and Michael J. Miller, IEEE Communications Magazine, vol. 22, No. Dec. 12, 1984, pp. 5-17.

\* cited by examiner

*Primary Examiner* — John Trimmings
(74) *Attorney, Agent, or Firm* — Eschweiler & Associates, LLC

(57) ABSTRACT

A method for retransmission of erroneous data in a communications system includes receiving data blocks at a receiver that have been generated in a transmitter by the use of an error correcting code. The received data blocks are decoded by a linear programming algorithm. One or more symbols in the decoded data block are identified by subjecting the symbols in the decoded data block to an integrality criterion. A retransmission of a part of the data block based on the one or more identified symbols is then initiated.

24 Claims, 3 Drawing Sheets

or an optical link.

RETRANSMISSION OF ERRONEOUS DATA

FIELD OF THE INVENTION

The invention relates to communications systems, and in particular to the retransmission of data by a transmitter in case the data can not be correctly decoded in a receiver.

BACKGROUND OF THE INVENTION

ARQ (Automatic Repeat request) and in particular HARQ (Hybrid ARQ) error control methods for data transmission are used in a variety of communications systems to ensure reliable data transmission. These techniques usually comprise a retransmission of a data packet by the transmitter in case the data packet received at the receiver could not be decoded correctly.

BRIEF DESCRIPTION OF THE DRAWINGS

Aspects of the invention are made more evident by way of example in the following detailed description of embodiments when read in conjunction with the attached drawing figures, wherein.

DETAILED DESCRIPTION OF THE INVENTION

In the following description and claims, the terms "coupled" and "connected", along with derivatives may be used. It should be understood that these terms may indicate that two elements co-operate or interact with each other regardless of whether they are in direct physical or electrical contact or are not in direct contact with each other. Further, although binary symbols (bits) are used for the purpose of explanation in the following, higher order symbols may equally be applied.

Figure 1:
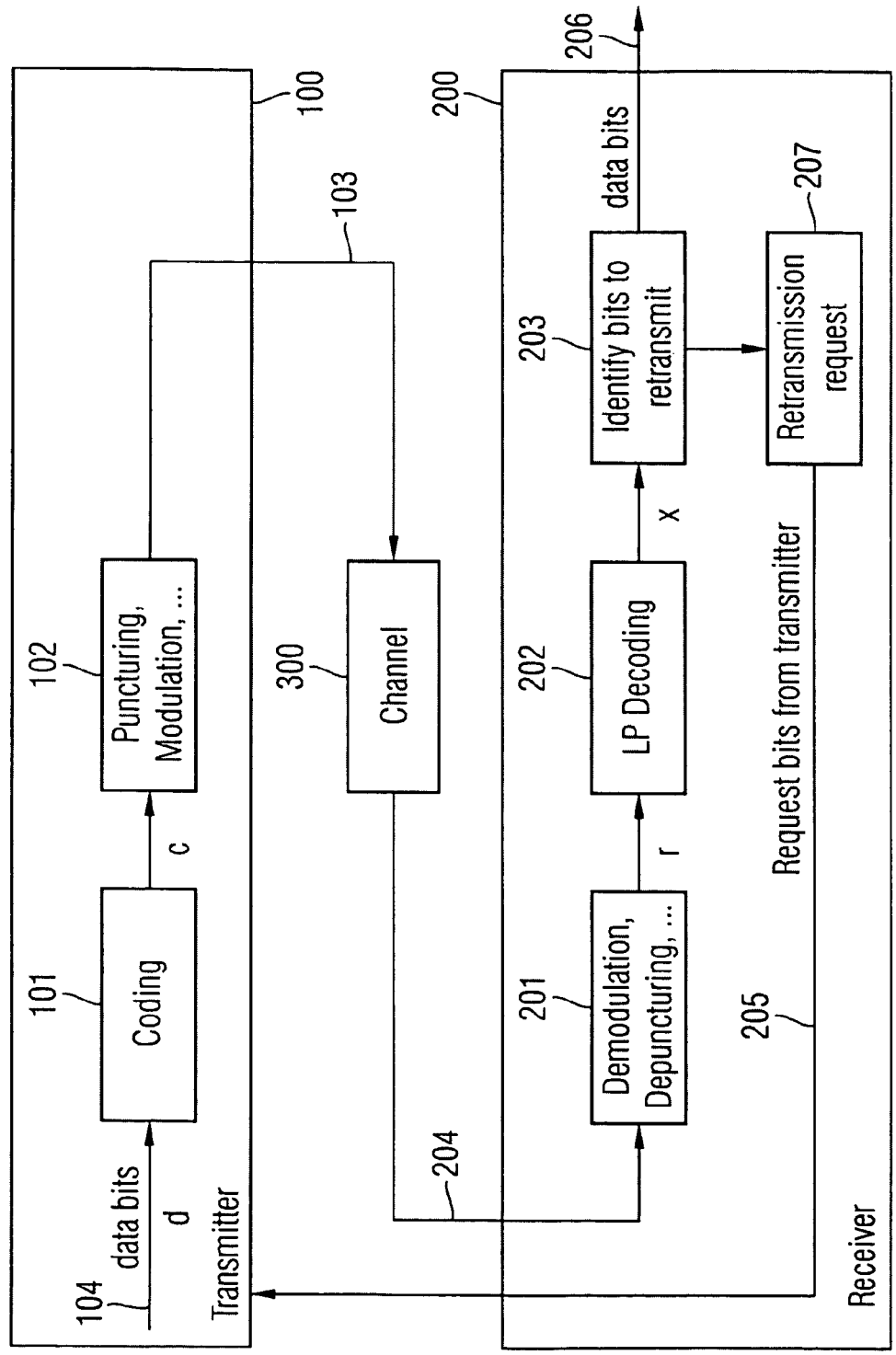
FIG. 1 is a schematic representation of a communications system comprising a transmitter and a receiver.

FIG. 1 shows an embodiment of a communications system comprising a transmitter 100 and a receiver 200. The transmitter 100 comprises an encoder 101 and may comprise further data processing units such as a puncturing device, a modulator etc. labeled by reference number 102. The receiver 200 may comprise a demodulator, a de-puncturing device etc. labeled by reference number 201, a decoder 202 and an identification unit 203. An output signal 103 of the transmitter 100 is transmitted via a channel 300 to form an input signal 204 of the receiver 200.

It is to be noted that FIG. 1 provides a schematic and strongly simplified representation of the receiver 100 and the transmitter 200 of the communications system. Usually, the transmitter 100 and the receiver 200 are equipped with additional data processing units (not shown) which are typically adapted to the specific field of application, the type of the channel 300, the desired functionality and other requirements or constraints. More specifically, the data communications system may be a radio communications system, in particular a mobile radio communications system, in which the channel 300 is represented by a radio link. Examples for such communications systems are digital video broadcasting-satellite (DVB-S) systems such as e.g. the DVB-S2 system, wireless local area network (WLAN) systems such as e.g. WLAN802.11n or wireless metropolitan area network (WMAN) systems such as e.g. stipulated in IEEE802.11. Moreover, embodiments may comprise communications systems in which the channel 300 is established by an electrical or an optical link.

The communications system depicted in FIG. 1 may use HARQ for error control. HARQ is the combination of forward error correction (FEC) and ARQ. Thus, HARQ schemes incorporate both the usage of an error-correcting code in the transmitter 100 for combating transmission errors and retransmission of data which could not be decoded correctly.

In FIG. 1, data bits $d=(d_1, \ldots, d_k)$ to be transmitted to the receiver 200 are fed at an input 104 into the encoder 101 of the transmitter 100. The encoder 101 may in one embodiment use a linear block code for encoding the data bits $d_i$, $i=1, \ldots k$. For instance, BCH (Bose-Chaudhuri-Hocquenghem) codes, terminated Turbo Codes or LDPC (Low Density Parity Check) codes may be used. LDPC-codes are also known as Gallager codes and are proposed for many future communications systems for FEC as an alternative or complement to Turbo Codes.

Any linear block code used in the encoder 101 can be described by its parity check matrix H. The parity check matrix H is of format m×n, i.e. has m rows and n columns. All codewords $c=(c_1, \ldots, c_n)$ must fulfill the equation $$Hc^T = 0. \quad (1)$$

Thus, c is a codeword of the linear block code represented by the parity check matrix H if and only if equation (1) is valid. Superscript T refers to the transpose of the indexed quantity.

Codeword generation out of the dataword d may be written as $$c = dG. \quad (2)$$

G is a generator matrix of the linear block code and is of k×n format with k=n−m (with k, n, m being integers). As known in the art, one or more generator matrices G may be computed from parity check matrix H. Operations in equations (1) and (2) are carried out in the binary field GF(2).

By way of example, let a binary linear block code be defined by $$H = \begin{pmatrix} 1 & 1 & 0 & 0 & 0 & 1 \\ 0 & 0 & 0 & 1 & 1 & 1 \\ 1 & 0 & 1 & 1 & 0 & 0 \end{pmatrix}. \quad (3)$$

A generator matrix G for this code is $$G = \begin{pmatrix} 1 & 0 & 0 & 1 & 0 & 1 \\ 0 & 1 & 0 & 0 & 1 & 1 \\ 0 & 0 & 1 & 1 & 1 & 0 \end{pmatrix}. \quad (4)$$

Using the generator matrix G, a codeword c (6 bits) can be generated from the dataword d (3 bits) by equation (2). By way of example, $d=(0,1,0)$ results in $c=(0,1,0,0,1,1)$.

The codeword c is fed into the puncturing and modulation unit 102. Different puncturing and/or modulation schemes may be applied therein. After optional puncturing and adding of supplementary data, the codeword c is sent out by the transmitter 100 as a data block.

The output of the puncturing and modulation unit 102 is subjected to further data processing in one embodiment in order to prepare the signal for channel transmission. Such further data processing is not depicted in FIG. 1. By way of example, if channel 300 is a radio channel, further data processing may comprise digital-to-analog-conversion, up-conversion of the signal to a radio frequency band, amplification and radiating the amplified signal via a transmit antenna (not shown).

At the receiver 200, the input signal 204 is obtained e.g. by a receive antenna (not shown) and subjected to signal processing not depicted in FIG. 1, such as e.g. filtering, down-conversion to an intermediate frequency (IF) band or baseband, analog-to-digital conversion and so on. The demodulation and de-puncturing unit 201 may demodulate and de-puncture the received signal 204 and outputs a received vector r. The n elements $r_i$, i=1, ..., n of the received vector r are real-valued.

The decoder 202 decodes the received vector r to yield the decoded word x. The n elements $x_i$, i=1, ..., n of the decoded word x are estimates of the n elements $c_i$ of codeword c. Decoder 202 is a so-called linear programming (LP) decoder in one embodiment. In an LP decoder a linear programming algorithm is used to compute the decoded word x out of the received vector r.

In the following, the operation of an LP decoder 202 will be described. LP decoding is an approximation to maximum-likelihood (ML) sequence decoding which is known to be the optimum decoding method in terms of minimizing block error probability. LP decoding relies on the concept that decoding of linear block codes can be interpreted as an integer LP problem. In mathematics, LP problems are known to involve the optimization of a linear objective function, subject to linear equality and inequality constraints. In LP decoding, the integer LP problem can be expressed as follows:
minimize $y^T x$ under the conditions $$Ax<=b$$

$$x=[x_i]; x_i \in \{0, 1\}. \quad (5)$$

Assuming a binary modulation scheme is used, the vector y, which is also referred to as the cost vector in LP theory, can be calculated out of the received vector r by $$y_i = \log\left(\frac{Pr(r_i \mid c_i = 0)}{Pr(r_i \mid c_i = 1)}\right),$$

i=1, ..., n, i.e. represents the vector of log-likelihood ratios. The matrix A and the vector b express the constraints of the integer LP problem and can be generated out of the parity check matrix H.

The inequality Ax<=b specifies a convex polyhedron over which the expression $y^T x$ (which is the objective function of the LP problem) is to be minimized. An example of how to derive the constraints A and b from H is set out further below.

The above LP problem (5) underlying LP decoding in decoder 202 is referred to as an integer LP problem because the elements $x_i$ of the decoded word x may only assume the values 0,1. Unfortunately, solving an integer LP is computationally intractable for codes used in practice. For this reason, the integer LP problem (5) is relaxed to the corresponding LP problem
minimize $y^T x$ under the conditions $$Ax<=b$$

$$x=[x_i]; 0<=x_i<=1. \quad (6)$$

This relaxed LP problem can then be solved with conventional linear programming solvers such as e.g. the simplex algorithm. However, the optimal solution of this relaxed LP problem (6) is not necessarily the optimal solution of the integer LP problem (5).

More specifically, if the solution of the (relaxed) LP problem is integer (that means all values x are within set tolerance limits around integers), the solution is provably equal to the solution of the integer LP problem. But it is possible that the optimal solution of the (relaxed) LP problem contains non-integer values. In this case, the decoding method fails. However, there may exist LP formulations which have a partial optimality property. This means that, if some of the element values $x_i$ of the decoded word x are integers, these values agree with the values of an optimal solution (namely an ML solution) of the integer LP problem (5).

The computational complexity of LP decoding depends on the algorithm used for selecting the constraints A and b. An effective approach for LP decoding is disclosed in M. H. Taghavi N., P. H. Siegel, "Adaptive Methods for Linear Programming Decoding", online available at: http://arxiv.org/abs/cs.IT/0703123, which document is incorporated herein by reference. However, basically all known and future approaches for solving the integer LP problem or the LP problem may be applied for LP decoding in the LP decoder 202 of the invention. In the following, a simple approach for deriving constraints A and b out of the parity check matrix H as set out in equation (3) will be demonstrated by way of example. Again, for the sake of simplicity, the parity check matrix H used here for the purpose of demonstration is much smaller than the parity check matrices of practically used LDPC codes.

Figure 2:
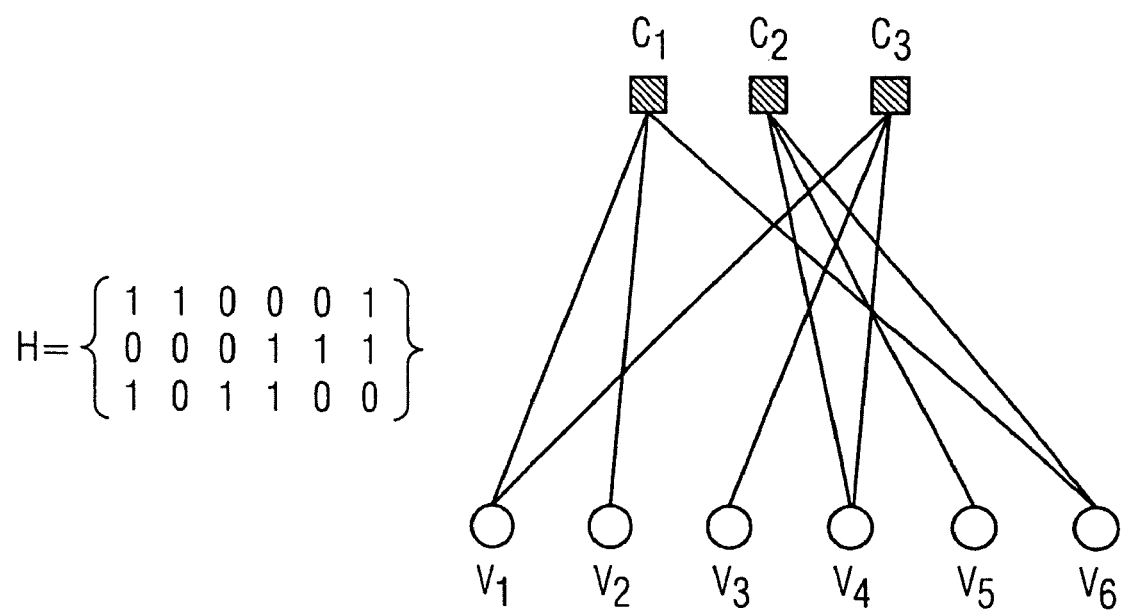
FIG. 2 shows a parity check matrix and a Tanner graph representation of the parity check matrix.

Matrix H can be used to generate a graph which is an equivalent representation of matrix H. This graph is referred to as a Tanner graph and is illustrated in FIG. 2. A Tanner graph is a bipartite graph. The nodes of this graph can be divided into two classes. One class is termed check nodes (C-nodes, drawn as squares) and the other class is termed as variable or bit nodes (V-nodes, drawn as circles). The C-nodes correspond to the rows of the parity check matrix H (e.g. $C_1$ corresponds to row 1 of H) and the V-nodes correspond to the column of the parity check matrix H (e.g. $V_1$ corresponds to column 1). If the corresponding row of a C-node in the H matrix has a 1 at the column j it means that this C-node is connected to the V-node $V_j$ and vice versa. The degree of a node in the Tanner graph is the number of edges connected to this node (e.g. V-node $V_6$ has degree 2, C-node $C_1$ has degree 3).

Given the parity check matrix H of equation (3), as shown in FIG. 2, one method to build the constraints Ax<=b is the following:

For the line j of H let N(j) be the set of columns whose entries are one. Or, equivalently, N(j) is the set of indices of those V-nodes which are connected to the C-node $C_j$. In the above example, N(1)={1,2,6}.

For every subset S of N(j) with |S| odd use the following constraint $$\Sigma_{i \in S} x_i - \Sigma_{i \in N(j) \setminus S} x_i <= |S|-1,$$

where |•| refers to the number of elements of subset S.

All the coefficients of the left side of these inequalities form matrix A, the constants of the right side of these inequalities form the vector b.

For the H matrix of equation (3) this results in $$A = \begin{pmatrix} 1 & -1 & 0 & 0 & 0 & -1 \\ -1 & 1 & 0 & 0 & 0 & -1 \\ -1 & -1 & 0 & 0 & 0 & 1 \\ 1 & 1 & 0 & 0 & 0 & 1 \\ 0 & 0 & 0 & 1 & -1 & -1 \\ 0 & 0 & 0 & -1 & 1 & -1 \\ 0 & 0 & 0 & -1 & -1 & 1 \\ 0 & 0 & 0 & 1 & 1 & 1 \\ 1 & 0 & -1 & -1 & 0 & 0 \\ -1 & 0 & 1 & -1 & 0 & 0 \\ -1 & 0 & -1 & 1 & 0 & 0 \\ 1 & 0 & 1 & 1 & 0 & 0 \end{pmatrix}, b = \begin{pmatrix} 0 \\ 0 \\ 0 \\ 2 \\ 0 \\ 0 \\ 0 \\ 2 \\ 0 \\ 0 \\ 0 \\ 2 \end{pmatrix}.$$

Returning to FIG. 1, the decoded word x is passed to the identification unit 203 in the receiver 200. The identification unit 203 identifies all bits which presumably have not been decoded correctly. More specifically, if an element value $x_i$ of the decoded word x is non-integer (i.e. not within set tolerance limits around an integer), the bit corresponding to this element value $x_i$ is decided to be incorrectly decoded. On the other hand, a bit is decided to be (presumably) decoded correctly if the corresponding element value $x_i$ assumes an integer, i.e. is within the set tolerance limits around the integer, say within a range of e.g. ±0.2 around the integer. In other words, the LP decoding based on solving the relaxed LP problem (6) provides knowledge about the reliability of each single data bit in the decoded word x.

It is to be noted that no parity check (see equation (1)) or other computation has to be performed on the decoding result x in order to obtain knowledge about the correctness of the decoding. The information whether or not a bit is decodable can be directly obtained from the decoding result x by a simple integrality check. In particular, if an element of the decoded word x is found to be non-integral, no assumption on the true integral bit value of this element has to be made for subsequent processing. Further, at least in the ideal case in which a solution of the relaxed LP problem strictly satisfies a partial optimality property, the knowledge about undecodable data may be maximal (i.e. individual to each bit).

On the basis of such detailed knowledge about undecodable data, it is possible to implement powerful algorithms for requesting bit retransmission. To this end, a retransmission request unit 207 is coupled to an output of the identification unit 203 and receives the information about the bits which have been found to be undecodable by the identification unit 203.

According to a first embodiment, the transmitter 100 is requested by the retransmission request unit 207 to retransmit only those bits which have been identified as undecodable. These bits may be requested via their addresses, i.e. by informing the transmitter 100 of the addresses of the undecodable bits. Such scheme would need a relatively high amount of up-link capacity (i.e. signaling capacity in the direction from the receiver 200 to the transmitter 100). There are several approaches to limit or reduce the up-link capacity needed. A first possibility would be to use a suitable source coding algorithm in the transmitter 100 to find a good trade-off between used up-link and down-link capacity. Another possibility is not to address each single undecodable bit individually by the retransmission request unit 207 but to request the retransmission of a predetermined part or parts of the codeword c which comprise(s) the bits identified to be undecodable. By way of example, the codeword c may be divided into a plurality of parts or sub-blocks each containing a plurality of bits and a sub-block is retransmitted if and only if at least one undecodable bit lying within this sub-block has been identified. Apparently, the number of sub-blocks in such codeword partition effects both the amount of up-link capacity and the amount of down-link capacity needed. More specifically, the higher the number of sub-blocks, the more up-link and the fewer down-link capacity has to be provided and vice versa. In any case, the amount of retransmitted bits (i.e. the down-link data traffic) can be reduced in comparison to conventional retransmission schemes in which either the whole data block or fixed bit patterns are used for retransmissions.

Further, it is possible to implement more sophisticated bit retransmission algorithms based on the integrality information supplied by the identification unit 203. For instance, a bit or a part of the codeword c containing this bit may be requested for retransmission dependent on whether other bits, which are linked to the bit under consideration, fail to satisfy the integrality criterion and therefore are identified by the identification unit 203. By way of example, bits $x_{p1}$, $x_{p2}, \ldots, x_{pl}$ are linked to bit $x_p$ under consideration by a parity check equation (or any other mathematical equation expressing a relationship between bit $x_p$ and bits $x_{p1}, x_{p2}, \ldots, x_{pl}$ in view of their decoding reliability). Then, bit $c_p$ corresponding to bit $x_p$ or a part of the codeword c including bit $c_p$ may be requested for retransmission only if a sufficient large number of related bits $x_{p1}, x_{p2}, \ldots, x_{pl}$ fail to meet the integrality criterion. Even if bit $x_p$ satisfies the integrality criterion (i.e. is not identified by the identification unit), such retransmission may be initiated in this case. As a further example, assuming again bit $x_p$ failed the integrality criterion, a retransmission of bit $c_p$ or a part of the codeword c containing this bit may be omitted if a sufficient large number of the related bits $x_{p1}$, $x_{p2}, \ldots, x_{pl}$ satisfy the integrality criterion.

Thus, the retransmission algorithm may solely depend on the results of the integrality information supplied by the identification unit 203. Alternatively, the retransmission algorithm optionally may further depend on the outcome of additional information such as e.g. the results of a CRC (Cyclic Redundancy Check) applied on the decoded word x. If the decoded word x passes the CRC, no retransmission is requested even if one or more bits of the decoded word x fail to comply with the integrality criterion, i.e. are identified by the identification unit 203. Such CRC unit (not shown) may be coupled to the output of the identification unit 203 and a control signal (CRC passed/CRC failed) generated in the CRC unit may be fed back to the retransmission request unit 207 to allow the retransmission request unit 207 to use the CRC information.

In FIG. 1, requests for retransmissions (e.g. single bits or sub-blocks) are communicated from the receiver 200 to the transmitter 100 by the request signal 205 output by the retransmission request unit 207. The request signal 205 may be transmitted to the transmitter 100 via an appropriate channel (not shown) such as e.g. a radio control channel. On the other hand, if the identification unit 203 finds all bits decodable, no retransmission is necessary and the decoded word x provided at port 206 may be used for further processing.

Often in practice, the decoded word x is obtained by combining the retransmitted vectors to previously received vectors r or log-likelihood ratio vectors y and using such combined vector for LP decoding. This combination (not shown in FIG. 1) usually reduces the number of retransmissions necessary for decoding and is conveniently useable for the proposed method.

In a practical embodiment, by way of example, a short LDPC code of length 96 bits with a code rate 50/96 has been used. The code is referred to as 96.3.963 and disclosed in Encyclopedia of Sparse Graph Codes, online available at: http://www.inference.phy.cam.ac.uk/mackay/codes/data.html. This and all other codes disclosed in this document may be used in encoder 101 for encoding and are incorporated in this document by reference.

Code 96.3.963 is represented by a parity check matrix H having n=96 columns and m=48 rows. Because H has two linear dependent rows, the length of the dataword d is 50 bits. The LP decoder 202 uses a LP algorithm as described in M. H. Taghavi N., P. H. Siegel, "Adaptive Methods for Linear Programming Decoding", online available at: http://arxiv.org/abs/cs.IT/0703123, and exemplified by way of example before. It was found by computer simulations that lowering the amount of retransmitted bits according to the inventive concept increases the throughput of the system at high signal-to-noise ratio (SNR) values.

Figure 3:
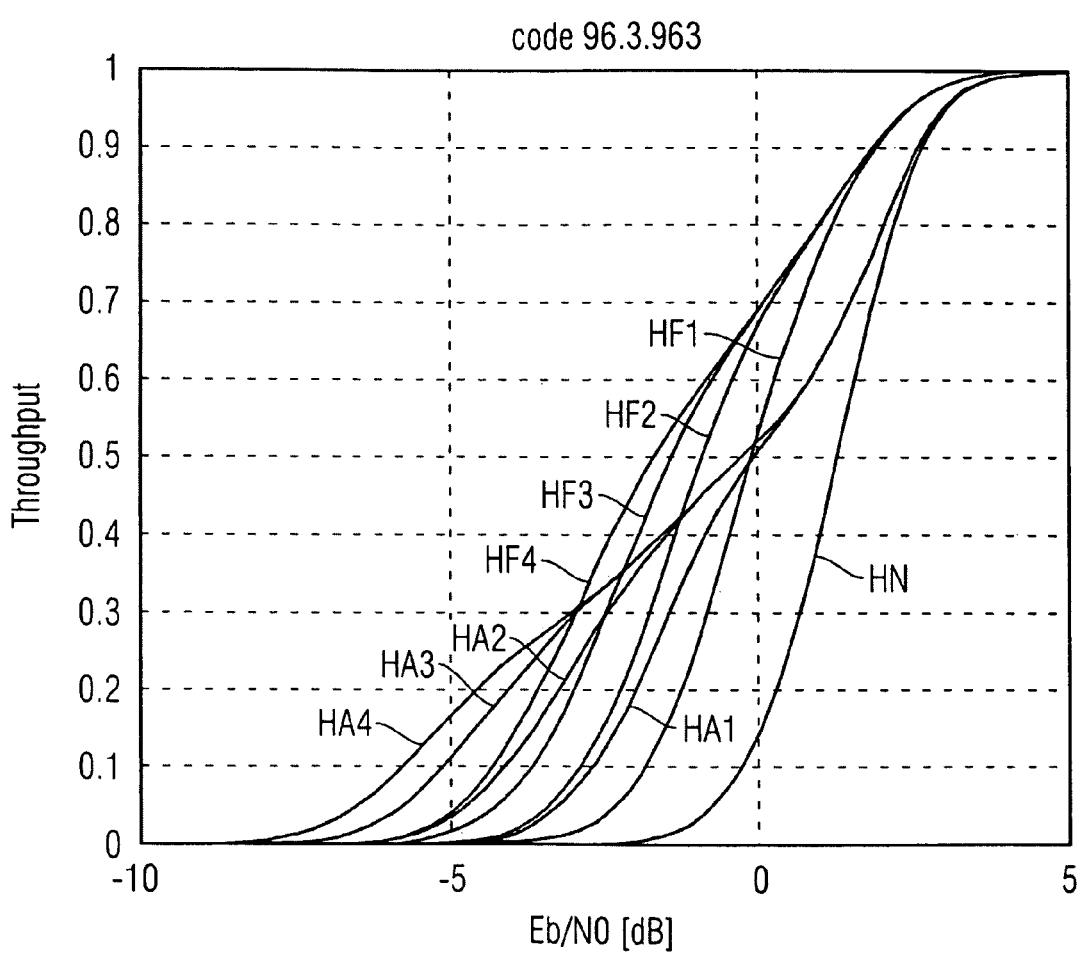
FIG. 3 is a graph showing the throughput in a communications system plotted versus the energy per bit to noise power spectral density ratio.

More specifically, FIG. 3 shows the throughput of the communications system plotted versus the energy per bit to noise power spectral density ratio Eb/N0 in units of dB. In FIG. 3, for simulation curves marked with "HA", all data bits of a codeword were retransmitted if the codeword was not decoded correctly. For the simulation curves marked with "HF", only those bits relating to fractional (non-integer) LP decoding results were retransmitted. The numbers after "HA" or "HF" specify the maximum number of retransmissions. One to four retransmissions were allowed in these simulations. After a retransmission, the log-likelihood ratios of the retransmitted bits are added to the vector of log-likelihood ratios of previously received bits of a data block before decoding. The curve marked with "HN" is the result of a simulation with no retransmissions.

The simulations results show that above approximately −3 dB of Eb/N0, the performance of the proposed method in terms of throughput is significantly (about 1 dB) better than the method of retransmitting whole data blocks. In this example, a LP formulation without a partial optimality property was used. When using a linear programming formulation having a partial optimality property, an additional performance gain may be expected.

FIG. 3 shows that retransmitting the whole codewords may be more effective than retransmitting single bits (or even sub-blocks) if Eb/N0 is low. Thus, a retransmission scheme using a plurality of retransmission modes may be adopted. If Eb/N0 is lower than a certain threshold (here e.g. −3 dB), a whole codeword retransmission may be performed if the identification unit 203 detects failure of decoding. Otherwise, if Eb/N0 exceeds such threshold, single bit or sub-block retransmission according to the above description may be carried out. Such multiple mode retransmission request approach may further improve the throughput of the communications system.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for retransmission of a data block portion in a communications system, comprising:
receiving data blocks at a receiver which have been generated by the use of an error correcting code in a transmitter;
decoding the received data blocks by linear programming decoding;
identifying one or more symbols in a decoded data block by subjecting the symbols in the decoded data block to an integrality criterion; and
initiating a retransmission of a part of the data block based on the one or more identified symbols.

2. The method of claim 1, wherein the integrality criterion determines that each decoded symbol that is not within a predetermined range around an integer is identified as a symbol having low confidence.

3. The method of claim 1, wherein linear programming decoding uses a linear programming algorithm with a partial optimality property which guarantees that each decoded symbol that is within a predetermined range around an integer coincides with the corresponding symbol of an optimum solution.

4. The method of claim 1, wherein the error correcting code used at the transmitter comprises a low density parity check code.

5. The method of claim 1, wherein the retransmitted part of the data block solely contains that symbol or symbols which correspond to the identified symbol or symbols.

6. The method of claim 1, wherein the retransmitted part of the data block comprises one or more predetermined sub-blocks of the data block which contain that symbol or symbols which correspond to the identified symbol or symbols.

7. A receiver in a communications system for retransmission of a data block portion, comprising:
a receiving unit configured to receive data blocks that have been generated by the use of an error correcting code in a transmitter;
a linear programming decoder configured to decode the received data blocks;
an identification unit configured to subject the symbols in one decoded data block to an integrality criterion, thereby identifying one or more symbols in the one decoded data block; and
a retransmission requesting unit configured to request retransmission of a part of the data block based on the one or more identified symbols.

8. The receiver of claim 7, wherein the integrality criterion determines that each decoded symbol that is not within limits around an integer is identified.

9. The receiver of claim 7, wherein the linear programming decoder is configured to execute a linear programming algorithm with a partial optimality property that guarantees that each decoded symbol that is within a predetermined range around an integer coincides with the corresponding symbol of an optimum solution.

10. The receiver of claim 7, wherein the error correcting code used at the transmitter comprises a low density parity check code.

11. The receiver of claim 7, wherein the retransmission requesting unit is configured to request retransmission solely of that symbol or symbols that correspond to the identified symbol or symbols.

12. The receiver of claim 7, wherein the retransmitted part of the data block comprises one or more predetermined sub-blocks of the data block that contain that symbol or symbols that correspond to the identified symbol or symbols.

13. A method for transmitting data in a communications system, comprising:
encoding data by using an error correcting code in a transmitter to obtain a block of encoded data;
transmitting the block of encoded data to a receiver;
receiving the data block corresponding to the transmitted block of encoded data at the receiver;
decoding the received data block by a linear programming algorithm to obtain a decoded data block;
identifying one or more symbols in the decoded data block by subjecting the symbols in the decoded data block to an integrality criterion; and
initiating a retransmission of a part of the data encoded in the block of encoded data, wherein the part of the data is dependent on the identified symbol or symbols.

14. The method of claim 13, wherein the integrality criterion determines that each decoded symbol that is within a predetermined range around an integer is identified.

15. The method of claim 13, wherein the linear programming algorithm has a partial optimality property that guarantees that each decoded symbol that is within a predetermined range around an integer coincides with the corresponding symbol of an optimum solution.

16. The method of claim 13, wherein the error correcting code used at the transmitter is a low density parity check code.

17. The method of claim 13, wherein the retransmitted part of the data solely contains that symbol or symbols that correspond to the identified symbol or symbols.

18. The method of claim 13, wherein the retransmitted part of the data block comprises one or more predetermined sub-blocks of the data block that contain that symbol or symbols that correspond to the identified symbol or symbols.

19. A communications system comprising a transmitter and a receiver for transmitting data in the communications system, wherein the transmitter comprises:
an encoding unit configured to encode data by using an error correcting code to obtain a block of encoded data;
a transmitting unit configured to transmit the block of encoded data to a receiver, and wherein the receiver comprises:
a receiving unit configured to receive a data block corresponding to the transmitted block of encoded data;
a receiving unit configured to decode the received data block by a linear programming algorithm to obtain a decoded data block;
an identification unit configured to identify one or more symbols in the decoded data block by subjecting the symbols in the decoded data block to an integrality criterion; and
a retransmission requesting unit configured to initiate a retransmission of a part of the data encoded in the block of encoded data, wherein the part of the data is dependent on the identified symbol or symbols.

20. The communications system of claim 19, wherein the integrality criterion determines that each decoded symbol that is not within a predetermined range around an integer is identified.

21. The communications system of claim 19, wherein the linear programming algorithm has a partial optimality property that guarantees that each decoded symbol that is within a predetermined range around an integer coincides with the corresponding symbol of an optimum solution.

22. The communications system of claim 19, wherein the encoding unit is configured to use a low density parity check code.

23. The communications system of claim 19, wherein the retransmission requesting unit is configured to request retransmission solely of that symbol or symbols that correspond to the identified symbol or symbols having low confidence.

24. The communications system of claim 19, wherein the retransmitted part of the data block comprises one or more predetermined sub-blocks of the data block that contains that symbol or symbols that correspond to the identified symbol or symbols.

* * * * *